United States Patent [19]

Agostinelli et al.

[11] Patent Number: 5,017,551
[45] Date of Patent: May 21, 1991

[54] BARRIER LAYER CONTAINING CONDUCTIVE ARTICLES

[75] Inventors: John A. Agostinelli, Rochester; Jose M. Mir, Webster; Gustavo R. Paz-Pujalt, Rochester; Mark Lelental, Rochester; Ralph A. Nicholas, III, Rochester, all of N.Y.

[73] Assignee: Eastman Kodak Company, Rochester, N.Y.

[21] Appl. No.: 330,409

[22] Filed: Mar. 30, 1989

Related U.S. Application Data

[63] Continuation of Ser. No. 85,047, Aug. 13, 1987, abandoned, and a continuation-in-part of Ser. No. 46,593, May 4, 1987, Pat. No. 4,880,770.

[51] Int. Cl.$^5$ ............................................. B32B 3/02
[52] U.S. Cl. ................................. 505/1; 505/701; 505/702; 505/703; 505/704; 428/426; 428/432; 428/433; 428/688; 428/700; 428/901; 428/930
[58] Field of Search .................... 505/1, 701–704; 428/209, 426, 432, 433, 688, 700, 901, 930

[56] References Cited

U.S. PATENT DOCUMENTS

| 3,873,341 | 3/1975 | Janus | 427/53.1 |
| 4,239,816 | 12/1980 | Breininger et al. | 427/168 |
| 4,316,785 | 2/1982 | Suzuki et al. | 427/63 |
| 4,395,436 | 7/1983 | Bianchi et al. | 427/53.1 |
| 4,401,474 | 8/1983 | Donley | 427/226 |
| 4,418,099 | 11/1983 | Cuevas et al. | 427/226 |
| 4,485,094 | 11/1984 | Pebler et al. | 427/226 |
| 4,496,398 | 1/1985 | Whitehouse | 427/226 |
| 4,507,643 | 3/1985 | Sunano et al. | 330/34 |
| 4,882,312 | 11/1989 | Mogro-Campero et al. | 505/1 |

OTHER PUBLICATIONS

Applied Phys. Letts. 55(5), 7-31-89, Chu et al., pp. 492–494.
Applied Phys. Letts. 53(25), 12-19-88, Mogro-Campero et al., pp. 2566–2568.
J. G. Bednorz and K. A. Müller, "Possible High $T_c$ Superconductivity in the Ba-La-Cu-O System", Z. Phys. B.—Condensed Matter, vol. 64, pp. 189–193 (1986).
C. W. Chu, P. H. Hor, R. L. Meng, L. Gao, Z. J. Huang, and Y. Q. Wang, "Evidence for Superconductivity above 40 K in the La-Ba-Cu-O Compound System", Physical Review Letters, vol. 58, No. 4, pp. 405–407, Jan. 1987.
C. W. Chu, P. H. Hor, R. L. Meng, L. Gao, and Z. J. Huang, "Superconductivity at 52.5 K in the Lanthanum-Barium-Copper-Oxide System", Science Reports, vol. 235, pp. 567–569, Jan. 1987.
R. J. Cava, R. B. vanDover, B. Batlog, and E. A. Rietman, "Bulk Superconductivity at 36 K in La$_{1.8}$Sr$_{0.2}$CuO$_4$", Physical Review Letters, vol. 58, No. 4, pp. 408–410, Jan. 1987.

(List continued on next page.)

Primary Examiner—Patrick Ryan
Attorney, Agent, or Firm—Carl O. Thomas

[57] ABSTRACT

A circuit element is disclosed comprised of a substrate and an electrically conductive layer located on the substrate. The electrically conductive layer is comprised of a crystalline rare earth alkaline earth copper oxide. The substrate is formed of a material which increases the electrical resistance of the conductive layer when in contact with the rare earth alkaline earth copper oxide during crystallization of the latter to an electrically conductive form. A barrier layer is interposed between the electrically conductive layer and the substrate. The barrier layer contains magnesium, a group IVA metal, or a platinum group metal, either in an elemental state or in the form of an oxide or silicide. The circuit element is produced by first forming the barrier layer on the substrate followed by coating conductor precursor metal-ligand compounds of each of rare earth, alkaline earth, and copper containing at least one thermally volatilizable ligand and heating the precursor metal-ligand compounds in the presence of oxygen to produce a crystalline rare earth alkaline earth copper oxide electrically conductive layer.

31 Claims, 3 Drawing Sheets

OTHER PUBLICATIONS

J. M. Tarascon, L. H. Greene, W. R. McKinnon, G. W. Hull, and T. H. Geballe, "Superconductivity at 40 K in the Oxygen-Defect Perovskites $La_{2-x}Sr_xCuO_{4-y}$", *Science Reports*, vol. 235, pp. 1373–1376, Mar. 13, 1987.

M. K. Wu, J. R. Ashburn, C. J. Torng, P. H. Hor, R. L. Meng, L. Gao, Z. J. Huang, Y. Q. Wang, and C. W. Chu, "Superconductivity at 93 K in a New Mixed–Phase Y–Ba–Cu–O Compound System at Ambient Pressure", *Physical Review Letters*, vol. 58, No. 9, pp. 908–910, Mar. 2, 1987.

M. Itoh and H. Ishigaki "Preparation of Superconducting Y–Ba–Cu–O Thick Film", *Japanese Journal of Applied Physics*, vol. 27, No. 3, Mar. 1988, pp. L420–L422.

Kawasaki et al. "Compositional and Structural Analyses for Optimizing the Preparation Conductions of Superconducting $(La_{1-x}Sr_x)CuO_{4-8}$ Films by Sputtering", *Japanese Journal of Applied Physics*, Part 2, vol. 26, No. 4, Apr. 1987, pp. L388–L390.

Koinuma et al. "Preparation of $(La_{1-x}Sr_x)_2CuO_{4-8}$ Superconducting Films by Screen Printing Method", *Japanese Journal of Applied Physics*, Part 2, vol. 26, No. 4, Apr. 1987, pp. L399–L401.

Meng et al., "High $T_c$ Superconducting Thin Films by Chemical Spray Deposition", *International Journal of Modern Physics B*, vol. 1, No. 2 (1987) pp. 579–582.

Vest et al., "Synthesis of Metallo-organic Compounds for MOD Powders and Films", MRS Proceedings, Symposium L. Defect Properties and Processing of High Technology Non-Metallic Materials, Boston, MA, Dec. 2–4, 1985.

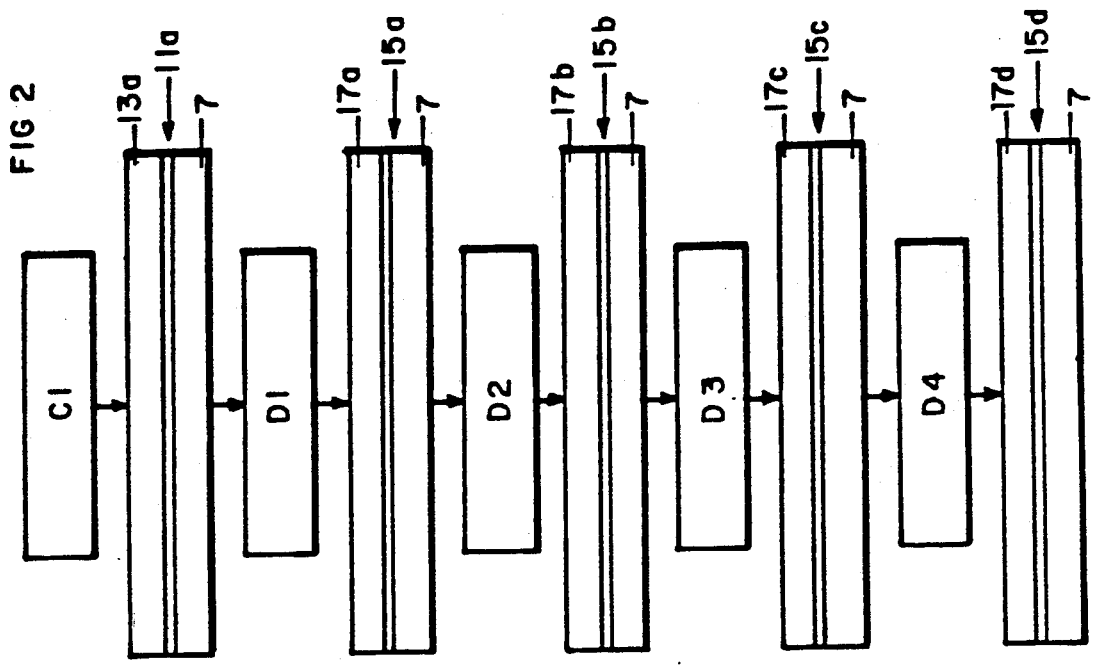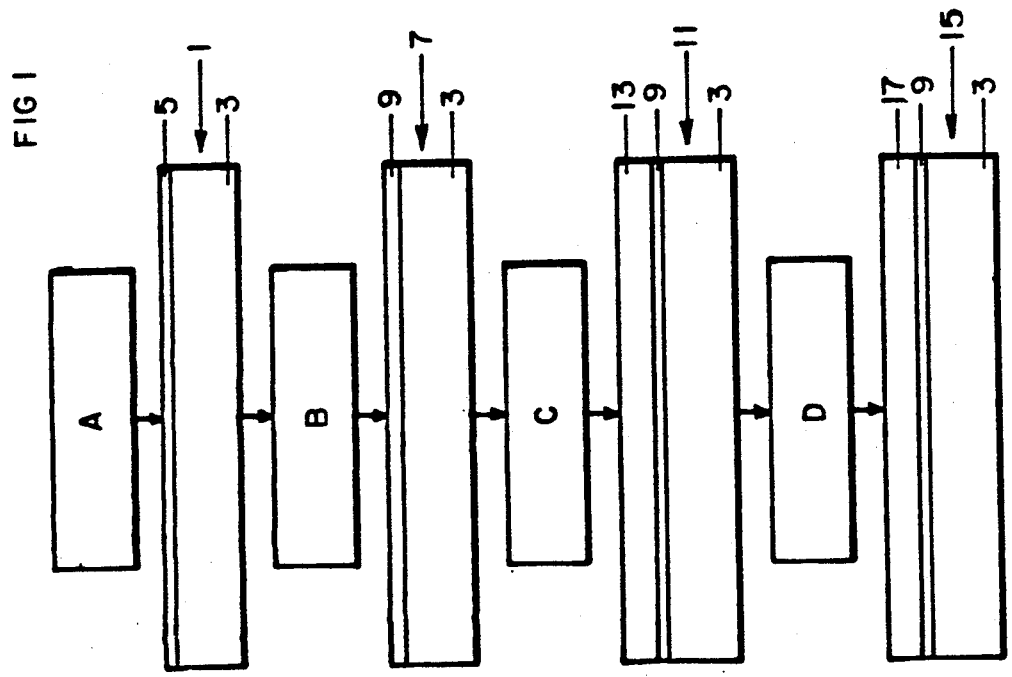

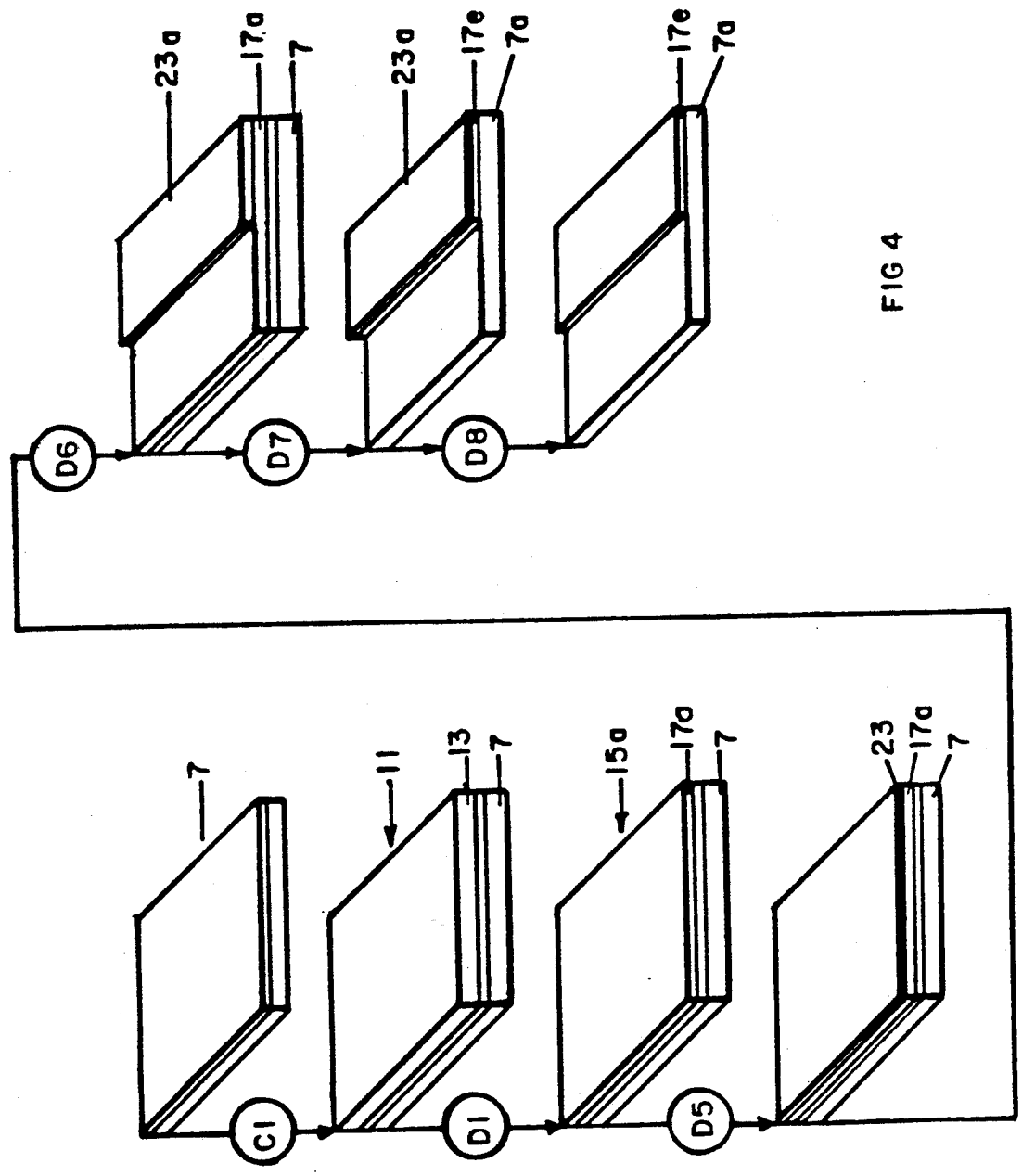

BARRIER LAYER CONTAINING CONDUCTIVE ARTICLES

FIELD OF THE INVENTION

The present invention relates to electrical circuit elements and to processes for their preparation.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials.

It has been recently recognized that certain rare earth alkaline earth copper oxides exhibit superconducting transition temperatures well in excess of the highest previously known metal oxide $T_c$, a 13.7° K. $T_c$ reported for lithium titanium oxide. These rare earth alkaline earth copper oxides also exhibit superconducting transition temperatures well in excess of the highest previously accepted reproducible $T_c$, 23.3° K. for the metal $Nb_3Ge$.

Recent discoveries of higher superconducting transition temperatures in rare earth alkaline earth copper oxides are reported in the following publications:

P-1: J. G. Bednorz and K. A. Müller, "Possible High $T_c$ Superconductivity in the Ba-La-Cu-O System", *Z. Phys. B. -Condensed Matter*, Vol. 64, pp. 189–193 (1986) revealed that polycrystalline compositions of the formula $Ba_xLa_{5-x}Cu_5O_{5(3-y)}$, where $x=1$ and 0.75 and $y>0$ exhibited superconducting transition temperatures in the 30° K. range.

P-2: C. W. Chu, P. H. Hor, R. L. Meng, L. Gao, Z. J. Huang, and Y. Q. Wang, "Evidence for Superconductivity above 40K in the La-Ba-Cu-O Compound System", *Physical Review Letters*, Vol. 58, No. 4, pp. 405–407, Jan. 1987, reported increasing $T_c$ to 40.2° K. at a pressure of 13 kbar. At the end of this article it is stated that M. K. Wu increased $T_c$ to 42° K. at ambient pressure by replacing Ba with Sr.

P-3: C. W. Chu, P. H. Hor, R. L. Meng, L. Gao, and Z. J. Huang, "Superconductivity at 52.5K in the Lanthanum-Barium-Copper-Oxide System", *Science Reports*, Vol. 235, pp. 567–569, Jan. 1987, a $T_c$ of 52.5° K. for $(La_{0.9}Ba_{0.1})_2CuO_{4-y}$ at high pressures.

P-4: R. J. Cava, R. B. vanDover, B. Batlog, and E. A. Rietman, "Bulk Superconductivity at 36K in $La_{1.8}Sr_{0.2}CuO_4$", *Physical Review Letters*, Vol. 58, No. 4, pp. 408–410, Jan. 1987, reported resistivity and magnetic susceptibility measurements in $La_{2-x}Sr_xCuO_4$, with a $T_c$ at 36.2° K. when $x=0.2$.

P-5: J. M. Tarascon, L. H. Greene, W. R. McKinnon, G. W. Hull, and T. H. Geballe, "Superconductivity at 40K in the Oxygen-Defect Perovskites $La_{2-x}Sr_xCuO_{4-y}$", *Science Reports*, Vol. 235, pp. 1373–1376, Mar. 13, 1987, reported title compounds ($0.05 \leq x \leq 1.1$) with a maximum $T_c$ of 39.3° K.

P-6: M. K. Wu, J. R. Ashburn, C. J. Torng, P. H. Hor, R. L. Meng, L. Gao, Z. J. Huang, Y. Q. Wang, and C. W. Chu, "Superconductivity at 93K in a New Mixed-Phase Y-Ba-Cu-O Compound System at Ambient Pressure", *Physical Review Letters*, Vol. 58, No. 9, pp. 908–910, Mar. 2, 1987, reported stable and reproducible superconducting transition temperatures between 80° and 93° K. at ambient pressures for materials generically represented by the formula $(L_{1-x}M_x)_aA_bD_y$, where $L=Y$, $M=Ba$, $A=Cu$, $D=O$, $x=0.4$, $a=2$, $b=1$, and $y \leq 4$.

The experimental details provided in publications P-1 through P-6 indicate that the rare earth alkaline earth copper oxides prepared and investigated were in the form of cylindrical pellets produced by forming an intermediate oxide by firing, grinding or otherwise pulverizing the intermediate oxide, compressing the particulate intermediate oxide formed into cylindrical pellets, and then sintering to produce a polycrystalline pellet. While cylindrical pellets are convenient articles for cooling and applying resistance measuring electrodes, both the pellets and their preparation procedure offer significant disadvantages to producing useful electrically conductive articles, particularly articles which exhibit high conductivity below ambient temperature—e.g., superconducting articles. First, the step of grinding or pulverizing the intermediate oxide on a commercial scale prior to sintering is both time and energy consuming and inherently susceptible to material degradation due to physical stress on the material itself, erosion of grinding machinery metal, and handling. Second, electrically conductive articles rarely take the form of pellets. Electrically conductive articles commonly include either thin or thick films forming conductive pathways on substrates, such as insulative and semiconductive substrates—e.g., printed and integrated circuits.

CROSS-REFERENCE TO RELATED FILING

Mir, Agostinelli, Peterson, Paz-Pujalt, Higberg, and Rajeswaran U.S. Ser. No. 046,593, filed May 4, 1987, titled CONDUCTIVE ARTICLES AND PROCESSES FOR THEIR PREPARATION, commonly assigned, now issued as U.S. Pat. No. 4,880,770, discloses articles in which an electrically conductive layer on a substrate exhibits a superconducting transition temperature in excess of 30° K. Conductive layers are disclosed comprised of a crystalline rare earth alkaline earth copper oxide. Processes of preparing these articles are disclosed in which a mixed metal oxide precursor is coated in solution and subsequently heated to its thermal decomposition temperature to create an amorphous mixed metal oxide layer. The amorphous layer is then heated to its crystallization temperature. Thin electrically conductive films are formed.

Strom, Carnall, Ferranti, and Mir U.S. Ser. No. 068,391, filed July 1, 1987, titled CONDUCTIVE THICK FILMS AND PROCESS FOR FILM PREPARATION, commonly assigned, now issued as U.S. Pat. No. 4,908,346, discloses circuit elements comprising an insulative substrate and means for providing a conductive path between at least two locations on the substrate including a thick film conductor which is comprised of a crystalline rare earth alkaline earth copper oxide layer having a thickness of at least 5 $\mu$m. The thick film conductor is formed by coating a conductor precursor on the insulative substrate and converting the conductor precursor to an electrical conductor. The conductor precursor is coated in the form of particles of metal-ligand compounds of each of rare earth, alkaline earth, and copper containing at least one thermally volatilizable ligand. The coated conductor precursor is heated in the presence of oxygen to form an intermediate coating on the substrate. The intermediate coating is converted to a crystalline rare earth alkaline earth copper oxide electrical conductor.

In attempting to form an electrically conductive, particularly superconductive, rare earth alkaline earth copper oxide layer on a substrate a difficulty that has been encountered is migration of substrate and copper containing oxide layer elements upon heating to the high temperatures required for crystallization, typically in the range of from 900° to 1100° C. Migration alters the composition of the copper containing oxide layer and interferes with formation of the crystal structures required for best conductivity results. While the difficulty of substrate contamination of the copper containing oxide layer can be ameliorated to a degree by increasing its thickness, the choice of substrates which produce better results in terms of copper containing oxide layer conductivity has remained restricted, particularly in forming thin ($<5$ μm) film thicknesses.

SUMMARY OF THE INVENTION

In one aspect this invention is directed to a circuit element comprised of a substrate and an electrically conductive layer located on the substrate. The circuit element is characterized in that the electrically conductive layer is comprised of a crystalline rare earth alkaline earth copper oxide, the substrate is formed of a material which increases the electrical resistance of the conductive layer when in contact with the rare earth alkaline earth copper oxide during its crystallization to an electrically conductive form, and a barrier layer is interposed between the electrically conductive layer and the substrate. The barrier layer contains a metal, in its elemental form or in the form of an oxide or silicide, chosen from the group consisting of magnesium, a group IVA metal, or a platinum group metal.

In another aspect this invention is directed to a process of forming a circuit element including coating a conductor precursor on a substrate and converting the conductor precursor to an electrical conductor. The process is characterized by the steps of choosing, as the conductor precursor, metal-ligand compounds of each of rare earth, alkaline earth, and copper containing at least one thermally volatilizable ligand; heating the precursor metal-ligand compounds in the presence of oxygen to produce a crystalline rare earth alkaline earth copper oxide electrically conductive layer; choosing as the substrate a material which increases the electrical resistance of the conductive layer when in contact with the rare earth alkaline earth copper oxide during its crystallization to an electrically conductive form; and prior to coating the conductor precursor on the support forming on the substrate a barrier layer. The barrier layer contains a metal, in its elemental form or in the form of an oxide or silicide, chosen from the group consisting of magnesium, a group IVA metal, or a platinum group metal.

BRIEF DESCRIPTION OF THE DRAWINGS

These and other advantages of the invention can be better appreciated by reference to the following detailed description of preferred embodiments considered in conjunction with the drawings, in which FIG. 1 is a schematic diagram showing process steps and articles produced thereby;

FIG. 2 is a schematic diagram of a portion of a preferred thin film process;

FIG. 4 is a schematic diagram of a pattern producing sequence of process steps.

DESCRIPTION PREFERRED EMBODIMENTS

Figure 3:
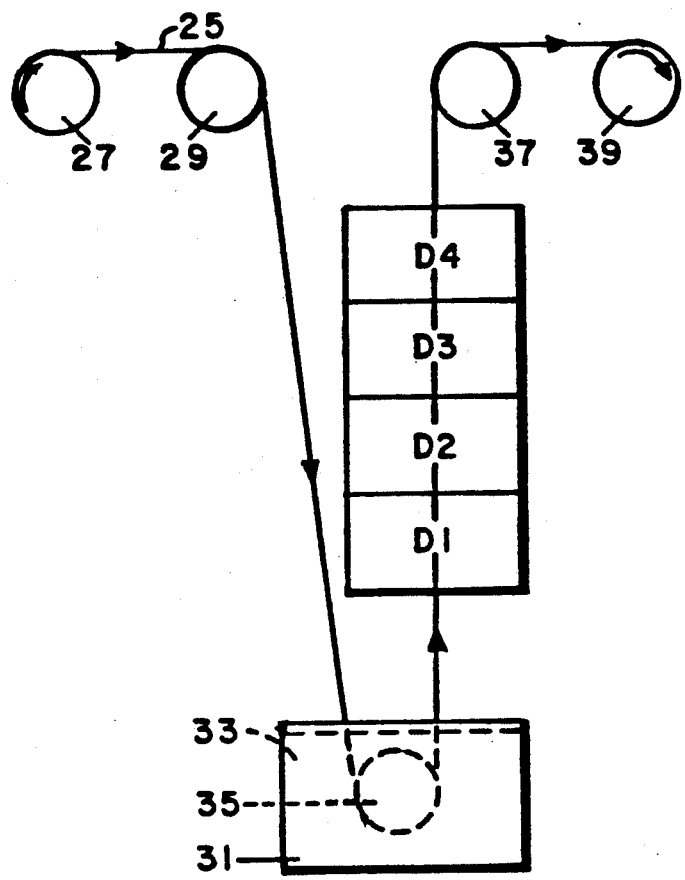
FIG. 3 is a schematic diagram of an arrangement for coating an elongated flexible substrate.

The present invention has as its purpose to make available electrical circuit elements containing a conductive rare earth alkaline earth copper oxide layer which is protected from substrate degradation of its conductive properties by a barrier layer interposed between the conductive layer and the substrate.

The barrier layer contains a metal, in its elemental form or in the form of an oxide or silicide, chosen from the group consisting of magnesium, a group IVA metal, and a platinum group metal. The term "group IVA metal" refers to the metals titanium, zirconium, and halfnium occupying Group IVA (International Union of Pure and Applied Chemistry version) of the periodic table of elements. The term "platinum group metal" refers to a metal from the second and third triads of Group VIIIA of the period table—i.e., ruthenium, rhodium, or palladium forming the second triad or osmium, iridium, or platinum forming the third triad.

The term "rare earth alkaline earth copper oxide" refers to a composition of matter containing at least one rare earth element, at least one alkaline earth element, copper, and oxygen. The term "rare earth" is employed to designate yttrium and lanthanides—i.e., elements of the lanthanide series. Lanthanum, samarium, europium, gadolinium, dysprosium, holmium, erbium, and ytterbium are particularly preferred lanthanides. The term "alkaline earth" indicates elements of Group 2 of the Periodic Table of elements as adopted by the American Chemical Society. Calcium, strontium and barium are preferred alkaline earth elements for the practice of this invention.

In keeping with the established practice in the ceramics art of shortening lengthy chemical names of mixed metal oxides by substituting acronyms based on the first letters of the metals present, the term "RAC" is hereinafter employed to indicate generically rare earth alkaline earth copper oxides. When it is intended to designate specifically a lanthanide or yttrium as the rare earth component, L or Y, respectively, is substituted for R; and when it is intended to designate specifically strontium or barium as the alkaline earth component, S or B, respectively, is substituted for A.

A preferred process for preparing an electrical circuit element according to the present invention is schematically illustrated in FIG. 1. In Step A of the preparation process, onto a substrate is coated a solution consisting essentially of a volatilizable film forming solvent and a barrier metal-ligand compound in addition to the barrier metal one or more ligands, each of which is thermally volatilizable. The resulting coated article as schematically shown consists of substrate 3 and a layer 5 formed by a barrier precursor (a barrier metal-ligand compound) and a film forming solvent.

In Step B article 1 is heated to a temperature sufficient to volatilize the ligands and the film forming solvent. The barrier clad substrate 7 resulting consists of substrate 3 and a barrier layer 9.

In Step C of the preparation process, onto the barrier layer is coated a composition consisting essentially of RAC precursors (metal-ligand compounds of each of rare earth, alkaline earth, and copper) containing at least one thermally volatilizable ligand. The resulting coated article 11 as schematically shown consists of the substrate 3, barrier layer 9, and a layer 13 formed of RAC precursors.

In Step D of the preparation process, the RAC precursor layer is converted into an electrically conductive crystalline RAC layer. Step D entails one or more heating steps in which volatilizable ligands contained within the RAC precursor are removed from the layer 13, oxidation of the rare earth, alkaline earth, and copper metals occurs, and crystallization of the resulting RAC layer occurs. As schematically shown, product circuit element 15 consists of the substrate 3, barrier layer 9, and conductive RAC layer 17. Depending upon specific choices of materials and preparation techniques, the article 17 can exhibit a high superconducting transition temperature, herein employed to designate a $T_c$ of greater than 30° C.

A preferred process for preparing thin ($<5$ μm) film circuit elements according to this invention once a substrate having a barrier layer has been produced can be appreciated by reference to FIG. 2. In Step C1 of the preparation process, onto a barrier clad substrate is coated a solution consisting essentially of a volatilizable film forming solvent and metal-ligand compounds of each of rare earth, alkaline earth, and copper containing at least one thermally volatilizable ligand. The resulting coated article 11a as schematically shown consists of barrier clad substrate 7 and a layer 13a formed by RAC precursors (metal-ligand compounds) and film forming solvent.

In Step D1 article 11a is heated to a temperature sufficient to volatilize the ligands and the film forming solvent. The element 15a resulting consists of barrier clad substrate 7 and amorphous RAC layer 17a. In its amorphous form the RAC coating exhibits relatively low levels of electrical conductivity.

To convert the amorphous RAc layer to a more highly conductive form it is necessary to induce crystallization of the RAC layer. In Step D2 the article 15a is heated to a temperature sufficient to convert the amorphous RAC layer to a more electrically conductive crystalline form. In article 15b the RAC layer 17b on barrier clad substrate 7 is crystalline.

Crystallization of the RAC layer occurs in two stages—crystal nucleation and crystal growth. It is in some instances preferred to achieve crystal nucleation at a somewhat different temperature than is employed for crystal growth. Microscopic examination of articles at an early stage of crystallization reveals crystal nuclei surrounded by at least one other RAC phase. Further heating of the RAC layer at the temperature of nucleation or, preferably, at a somewhat higher temperature increases the size of the crystal nuclei at the expense of the surrounding RAC phase or phases until facets of adjacent crystals are grown into electrically conductive juxtaposition.

According to accepted percolation theory, for a layer consisting of conducting spheres randomly located in a surrounding nonconducting medium the spheres must account for at least 45 percent by volume of the layer for satisfactory electrical conductivity to be realized. If conducting particles of other geometric forms, particularly elongated forms, are substituted for the spheres, the conducting particles can account for less of the layer volume while still realizing satisfactory layer electrical conductivity. Similarly, electrical conductivity can be realized with a lesser proportion of conducting particles when the surrounding medium is also conductive. Thus, all layers containing at least 45 percent by volume electrically conductive particles are by theory electrically conductive.

Although satisfactory electrical conductivity can be realized with a lesser volume of the crystalline phase, it is generally contemplated that in the crystallized RAC layer the crystalline phase will account for at least 45 percent by volume and preferably 70 percent by volume of the total RAC layer. From microscopic examination of highly crystalline RAC layers exhibiting high levels of electrical conductivity it has been observed that layers can be formed in which little, if any, of the RAC phase surrounding the crystal nuclei remains. In other words greater than 90 percent (and in many instances greater than 99 percent) by volume of the RAC layer is accounted for by the desired crystalline phase.

To achieve crystallization the RAC layer can be heated to any convenient temperature level. While the barrier layer allows heating to higher crystallization temperatures than would otherwise be acceptable, it is generally preferred that the RAC layer be heated no higher than is required for satisfactory crystallization. Heating to achieve crystallization can, for example, be limited to temperatures below the melting point of the RAC composition forming the layer. Microscopic examination of coatings of some RAC compositions has revealed that extending heating temperatures or times beyond those producing crystallization can result in rounding of crystal corners and edges. It is believed that the rounding resulting from further heating reduces the area of contact between adjacent crystal facets and thus restricts the conduction path through the crystalline RAC layer. From microscopic examination of RAC layers optimum heating times can be selected for maximizing both the proportion of the RAC layer accounted for by the crystalline phase and the desired configuration of the crystals produced, thereby maximizing electrical conductivity.

Step D3 entails controlled cooling of the RAC layer from its crystallization temperature. By slowing the rate of cooling of the crystalline RAC layer imperfections in the crystal lattices can be reduced and electrical conductivity, which is favored with increasing order in the crystal structure, is increased. Cooling rates of 25° C. per minute or less are contemplated until the crystalline RAC layer reaches a temperature of at least 500° C. or, preferably, 200° C. Below these temperatures the lattice is sufficiently rigid that the desired crystal structure is well established. The article 15c produced is formed of the annealed crystalline RAC layer 17c on barrier clad substrate 7.

While the article 15c exhibits high levels of electrical conductivity, in some instances further heating of the article 15c in an oxygen enriched atmosphere has been observed to increase electrical conductivity further. In addition to oxygen supplied from the ligands the oxygen forming the crystalline RAC layer is obtained from the ambient atmosphere, typically air. It is believed that in some instances, depending upon the crystal structure being produced, ambient air does not provide the proportion of oxygen needed to satisfy entirely the available crystal lattice sites.

Therefore, optional Step D4 entails heating the article 15c in an oxygen enriched atmosphere, preferably pure oxygen. The object is to equilibrate the RAC crystalline layer with the oxygen enriched atmosphere, thereby introducing sufficient oxygen into the crystal lattice structure. Temperatures for oxygen enrichment of the crystalline RAC layer are above the minimum 200° C. annealing temperatures employed in Step D3 described above. To be effective in introducing oxygen into the crystal lattice temperatures above those at which the lattice becomes rigid are necessary. The duration and temperature of heating are interrelated, with higher temperatures allowing shorter oxygen enrichment times to be employed. For maximum oxygen enrichment of the RAC layer the rate of cooling should be less than 25° C. per minute, preferably less than 15° C. per minute, within the temperature range of from about 500° C. to 300° C.

In preparing RAC layers shown to be benefitted by oxygen enrichment of the ambient atmosphere Step D4 can be consolidated with either or both of Steps D2 and D3. Oxygen enrichment is particularly compatible with Step D3, allowing annealing out of crystal lattice defects and correction of crystal lattice oxygen deficiencies to proceed concurrently.

The final electrically conductive article 15d is comprised of a crystalline, electrically conductive RAC layer 17d on barrier clad substrate 7.

The process described for preparing electrically conductive articles having RAC layers offers several distinct advantages. One of the most significant advantages is that the electrically conductive RAC layer is protected from direct contact with the substrate throughout the process. This allows a broader range of substrate materials to be employed and allows better electrical conduction properties to be achieved. It further allows, but does not require, higher temperatures to be employed in producing the conductive RAC layer. Still further, thinner RAC layers having acceptable electrical conduction properties can be realized. In many instances the presence of the barrier layer allows superconductive and particularly high transition temperature superconductive RAC layer characteristics to be obtained which would be difficult or impossible to realize in the absence of the barrier layer.

Another significant advantage of the process described above is that the proportions of rare earth, alkaline earth, and copper elements in the final RAC layer 17d exactly correspond to those present in the RAC precursor layer 13a. In other words, the final proportion of rare earth, alkaline earth, and copper elements is determined merely by mixing in the desired proportions in the film forming solvent the metal-ligand compounds employed as starting materials. This avoids what can be tedious and extended trial and error adjustments of proportions required by commonly employed metal oxide deposition techniques, such as sputtering and vacuum vapor deposition. Further, the present process does not require any reduction of atmospheric pressures, and thus no equipment for producing either high or low vacuum.

A further significant advantage of the process of this invention is that it can be applied to the fabrication of electrically conductive articles of varied geometry, particularly those geometrical forms of electrical conductors most commonly employed.

The present invention lends itself readily to the preparation of elongated electrically conductive articles, particularly flexible elongated electrically conductive articles, such as those employed as electrical leads, conductive windings in electromagnets, conductive armature and/or field windings in electrical motors and generators, conductive windings in transformers, conductive windings in solenoids, and as long distance electrical transmission lines. Contemplated flexible elongated electrically conductive articles include those referred to in the art as rods, wires, fibers, filaments, threads, strands, and the like. In addition conductive cladding of ribbons, sheets, foils, and films is contemplated.

A coating process particularly adapted to coating flexible substrates can be illustrated by reference to FIG. 3, wherein an elongated flexible barrier clad substrate 25 is unwound from a supply spool 27 and passed downwardly over a guide roller 29 into a reservoir 31. The reservoir contains a film forming solvent with metal-ligand compounds dissolved therein, as described above in connection with Step C1, shown as a liquid body 33. The flexible substrate is drawn over a lower guide roller 35 while immersed in the liquid and then passed upwardly to a third guide roller 37.

As the flexible substrate is drawn upwardly it emerges from the liquid body bearing an annular thin, uniform surface layer corresponding to layer 13a in FIG. 2. Between the reservoir and the third guide roller the coated substrate is drawn through a heating zone to complete in different regions of the heating zone process Steps D1, D2, D3, and D4 sequentially, as previously described. To accommodate needs for different residence times within the various heating regions the lengths of the different regions can be adjusted. Additionally, residence time of a substrate within any heating region can be further increased by employing laterally diverting guides, so one or a number of coated substrate festoon-like path diversions are created within the heating region.

After passing over the third guide roller the substrate, bearing an annular crystalline electrically conductive RAC layer is wound onto a storage spool 39. Where the RAC layer is coated on a flexible substrate, it is preferred to maintain the thickness of the RAC layer at 2 $\mu$m or less, preferably 1.0 $\mu$m or less, so that it exhibits adequate flexibility. Flexing of the RAC layer required by guiding and spooling by can be reduced by increasing the radius of curvature imposed by the third guide roller and storage spool.

The arrangement shown in FIG. 3 for applying a flexible RAC layer to a flexible substrate is, of course, merely illustrative of a number of approaches which can be employed to apply a RAC layer to a flexible substrate. Where it is more convenient to perform process steps D1, D2, D3, and D4 in a horizontally offset rather than vertically offset spatial relationship, instead of applying the RAC precursors and film forming solvent by immersion of the substrate, other conventional coating approaches can be employed for application, such as roll coating, spraying, brushing, curtain coating, extrusion, or the like. It is generally preferred to avoid guide contact of the coated substrate between application of the RAC precursors and completion of Step D1. However, once a solid RAC layer exists on the substrate, guide contact with the substrate within or between any one of process Step D2, D3, and D4 locations can be undertaken, as desired for convenient spatial orientation. Although the process described in connection with FIG. 3 begins with an elongated flexible substrate coated with a barrier layer, it is appreciated that essentially similar process steps can, if desired, be undertaken to form the barrier layer on the substrate before undertaking formation of the RAC layer.

While flexible electrical conductors of extended length serve a variety of important applications, there are many other applications for electrical conductors, particularly those located on limited portions of substantially planar surfaces of substrates. Such applications include those served by conventional printed, integrated, and hybrid circuits. In such circuits limited, if any, flexibility of the electrical conductor is required, but an ability to define areally—i.e., pattern, the electrical conductor with a high degree of precision is in many instances of the utmost importance. The present invention is compatible with precise patterning of the electrical conductor on a substrate surface.

Patterning of an electrical conductor according to this invention is illustrated by reference to FIG. 4. Barrier clad substrate 7 is coated on its upper planar surface with a uniform RAC precursor layer 13a as described above in connection with process Step C1 to form initial coated article 11a. Process Step D1, described above, is performed on article 11a to produce article 15a, described above, comprised of amorphous RAC layer 17a and barrier clad substrate 7.

The amorphous RAC layer lends itself to precise pattern definition and produces results generally superior to those achieved by patterning the RAC precursor layer from which it is formed or the crystalline RAC layer which is produced by further processing. The RAC precursor layer is often liquid before performing process Step D1 and is in all instances softer and more easily damaged in handling than the amorphous RAC layer. The crystalline RAC layer cannot be etched with the same boundary precision as the amorphous RAC layer, since etch rates vary from point to point based on local variations in the crystal faces and boundaries presented to the etchant. Patterning of either the RAC precursor layer or the crystalline RAC layer is specifically recognized as a viable alternative to patterning the amorphous RAC layer for applications permitting more tolerance of conductor dimensions. For example, screen printing the RAC precursor layer on a substrate to form a printed circuit is specifically contemplated.

While the amorphous RAC layer can be patterned employing any conventional approach for patterning metal oxides, for more precise edge definitions the preferred approach is to photopattern the amorphous RAC layer employing any of the photoresist compositions conventionally employed for the precise definition of printed circuit or integrated circuit conductive layers. In a preferred form of the process, a uniform photoresist layer 23 is applied to the amorphous RAC layer 17a as indicated by process Step D5. The photoresist layer can be formed by applying a liquid photoresist composition to the amorphous RAC layer, spinning the substrate to insure uniformity of the coating, and drying the photoresist. Another approach is to laminate a preformed photoresist layer supported on a transparent film to the amorphous RAC layer.

The photoresist layer is then imagewise exposed to radiation, usually through a mask. The photoresist can then be removed selectively as a function of exposure by development. Positive working photoresists are removed on development from areas which are exposed to imaging radiation while negative working photoresists are removed only in areas which are not exposed to imaging radiation. Exposure and development are indicated by process Step D6. Following this step patterned photoresist layer 23a is left on a portion or portions of the amorphous RAC layer 17a. Although the patterned residual photoresist layer is for convenience shown of a simple geometrical form, it is appreciated that in practice the patterned photoresist can take any of a wide variety of geometrical forms, including intricate and thin line width patterns, with line widths ranging into the sub-micrometer range.

Following patterning of the photoresist layer, portions of the RAC layer which are not protected by the photoresist can be selectively removed by etching, as indicated by process Step D7. This converts the amorphous RAC layer 17a to a patterned RAC layer 17e confined to areas corresponding to that of the photoresist. Note that in the process of etching the barrier clad substrate may be modified by removal of the barrier in unprotected areas to produce a modified barrier clad substrate 7a. Whether or not the unprotected barrier is removed will depend, of course, on the specific etchant employed. However, it is important to note that there is no requirement that the etchant be selective to the amorphous RAC layer as opposed to the barrier material.

Following patterning of the amorphous RAC layer the patterned photoresist is removed, as indicated by process Step D8. The final article, shown in FIG. 4 as consisting of the partially barrier clad substrate 7a and patterned amorphous RAC layer 17e, is then further processed as indicated in FIG. 2, picking up with process Step D2. The crystalline RAC layer formed in the final product conforms to the patterned amorphous RAC layer.

In the process of preparing a patterned article described above it is noted that once an article is formed having an amorphous RAC layer on a substrate it can be patterned to serve any of a wide variety of circuit applications, depending upon the circuit pattern chosen. It is therefore recognized that instead of or as an alternative to offering patterned articles for sale a manufacturer can instead elect to sell articles with unpatterned amorphous RAC layers on a barrier clad substrate, with or without an unpatterned photoresist layer, to subsequent fabricators. It will often be convenient in this instance to locate a removable layer or film over the amorphous RAC layer for its protection prior to further fabrication. The subsequent fabricator can undertake the patterned exposure and further processing required to produce a finished electrical circuit element.

To crystallize a RAC layer and to perform the optional, but preferred annealing and oxygen enrichment steps both the substrate and RAC layer are heated uniformly. This can be done employing any conventional oven. In some instances, however, either to protect the substrate from rising to the peak temperatures encountered by the RAC layer or simply to avoid the investment in an oven by fabricator, it is contemplated that the RAC layer will be selectively heated. This can be accomplished by employing a radiant heat source, such as a lamp—e.g., a quartz lamp. Lamps of this type are commercially available for achieving rapid thermal annealing of various conventional layers and can be readily applied to the practice of the invention. These lamps rapidly transmit high levels of electromagnetic energy to the RAC layer, allowing it to be brought to its crystallization temperature without placing the substrate in an oven.

A diverse approach for producing patterned electrical conductors can be practiced by employing article 15a comprised of the uniform amorphous RAC layer 17a and barrier clad substrate 7 as a starting element. Instead of patterning the amorphous RAC layer followed by crystallization of the remaining portions of the layer, the amorphous RAC layer is imagewise addressed to produce crystallization selectively only in areas intended to be rendered electrically conductive. For example, by addressing the amorphous RAC layer with a laser, areas directly impinged by the laser beam can be selectively crystallized to an electrically conductive form, leaving the remaining amorphous areas unaffected. To define the conductive pattern generated it is only necessary to control the path of the laser beam.

Where a manufacturer chooses to sell an article consisting of a uniform amorphous RAC layer on a barrier clad substrate, this approach to patterning can be more attractive than the uniform heating processes described above, since no oven is required to reach the temperatures typically required for crystallization. The fabricator choosing laser patterning may, in fact, require no other heating equipment. Thus, a very simple approach to forming a crystalline RAC pattern is available.

It is, of course, recognized that additional heating for purposes of annealing or oxygen saturation can be undertaken, following lamp or laser crystallization, by heating in any desired manner. One approach is to heat at least amorphous layer 17a of the article 15a to a temperature above its minimum annealing temperature and then laser address the heated article. This facilitates annealing and oxygen enrichment without requiring heating the entire article uniformly to the significantly higher levels otherwise required for crystal nucleation and growth.

Another variation on the laser patterning approach is to follow the laser responsible for crystallization with one or more passes from a lower intensity laser beam to retard the rate of cooling and thereby enhance annealing. For example, a laser beam can be swept across an area of the substrate surface to produce crystallization and then reduced in intensity or defocused and swept back across the same area to facilitate annealing. By defocusing the laser beam on subsequent passes over the same area the laser energy is spread over a larger area so that the maximum effective temperature levels achieved are reduced. The advantage of employing one laser for multiple passes is that alignments of laser beam paths are more easily realized. Additionally or alternatively, the rapidity with which the laser is swept across the exposed area can be adjusted to control the temperature to which it heats the RAC layer. Other laser scanning variations are, of course, possible.

Both lamp heating and laser scanning allow a broader range of substrate materials to be considered, particularly those which, though capable of withstanding ligand and solvent volatilization temperatures, are susceptible to degradation at crystallization temperatures. By choosing wavelengths in spectral regions to which the amorphous RAC layer is opaque or at least highly absorbing, direct radiant heating of the substrate can be reduced or eliminated. In this instance the bulk of the radiation is intercepted in the RAC layer before it reaches the substrate barrier. The substrate is also protected from direct radiant heating by the barrier layer. By proper choice of radiant energy wavelengths the barrier layer can reflect a high proportion of total radiant energy received.

To avoid coating imperfections in the thin film process described above the thickness of an amorphous RAC layer produced in a single process sequence is maintained at 1 $\mu$m or less, preferably 0.6 $\mu$m or less, and optimally 0.4 $\mu$m or less, a single process sequence being understood to constitute the steps described above for forming an amorphous RAC layer. By repeating the process sequence one or more times an amorphous RAC layer of any desired thickness can be built up.

In the process of fabrication described above the formation of the desired RAC layer begins with the formation of a RAC precursor layer. To form the precursor layer a solution of a film forming solvent, a rare earth metal compound, an alkaline earth metal compound, and a copper compound is prepared. Each of the rare earth, alkaline earth, and copper compounds consists of metal ion and one or more volatilizable ligands. By "volatilizable" it is meant that the ligand or its component elements other than oxygen can be removed from the substrate surface at temperatures below the crystallization temperature of the RAC layer. In many instances organic ligands breakdown to inorganic residues, such as carbonates, at relatively low temperatures, with higher temperature being required to remove residual carbon. A ligand oxygen atom bonded directly to a metal is often retained with the metal in the RAC layer, although other ligand oxygen atoms are generally removed. At least 95 percent of the ligands and their component atoms other than oxygen are preferably outgassed at temperatures of less than 600° C. On the other hand, to avoid loss of materials before or during initial coating of the metal-ligand compounds, it is preferred that the ligands exhibit limited, if any, volatility at ambient temperatures. Metal-ligand compounds having any significant volatility below their decomposition temperature are preferably avoided.

Metalorganic compounds, such as metal alkyls, alkoxides, $\beta$-diketone derivatives, and metal salts of organic acids—e.g., carboxylic acids, constitute preferred metal-ligand compounds for preparing RAC precursor coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal-ligand solubility. While very simple organic ligands, such as oxalate and acetate ligands, can be employed in one or more metal-ligands compounds, depending upon the film forming solvent and other metal-ligand compound choices, it is generally preferred to choose organic ligands containing at least 4 carbon atoms. The reason for this is to avoid crystallization of the metal-ligand compound and to improve solubility. When heating is begun to remove the film forming solvent and ligands, the solvent usually readily evaporates at temperatures well below those required to remove the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. This works against the molecular level uniformity of rare earth, alkaline earth, and copper ions sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the molecular bulk or modifying the chain configuration of organic ligands to avoid any propensity toward metalorganic compound crystallization on solvent removal, another technique which can be employed is to incorporate in the film forming solvent a separate compound to act as a film promoting agent, such as a higher molecular weight branched chain organic compound. This can, for example, take the form of a branched chain hydrocarbon or substituted hydrocarbon, such as a terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds include metal 2-ethylhexanoates, naphthenates, neodecanoates, butoxides, isopropoxides, rosinates (e.g., abietates), cyclohexanebutyrates, and acetylacetonates, where the metal can be any of the rare earth, alkaline earth, or copper elements to be incorporated in the RAC layer. Exemplary preferred film forming agents include 2-ethylhexanoic acid, rosin (e.g., abietic acid), ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

As previously noted, the metal-ligand compounds are incorporated in the film forming solvent in the proportion desired in the final crystalline RAC layer. The rare earth, alkaline earth, and copper can each be reacted with the same ligand forming compound or with different ligand forming compounds. The metal-ligand compounds can be incorporated in the film forming solvent in any convenient concentration up to their saturation limit at ambient temperature. Generally a concentration is chosen which provides the desired crystalline RAC layer thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time of spinning, all of which can be precisely controlled. Differences in the amount of the coating composition applied to the substrate are not reflected in the thickness of the final coating. Centrifugal forces generated by spinning cause excess material to be rejected peripherally from the article.

The foregoing process of coating RAC precursors in solution is particularly suited to forming thin films. The term "thin film" is employed to indicate films having thicknesses of less than 5 $\mu$m, such films most typically having thicknesses of less than 1 $\mu$m. The term "thick film" is employed in its art recognized usage to indicate films having thicknesses in excess of 5 $\mu$m.

Figure 5:
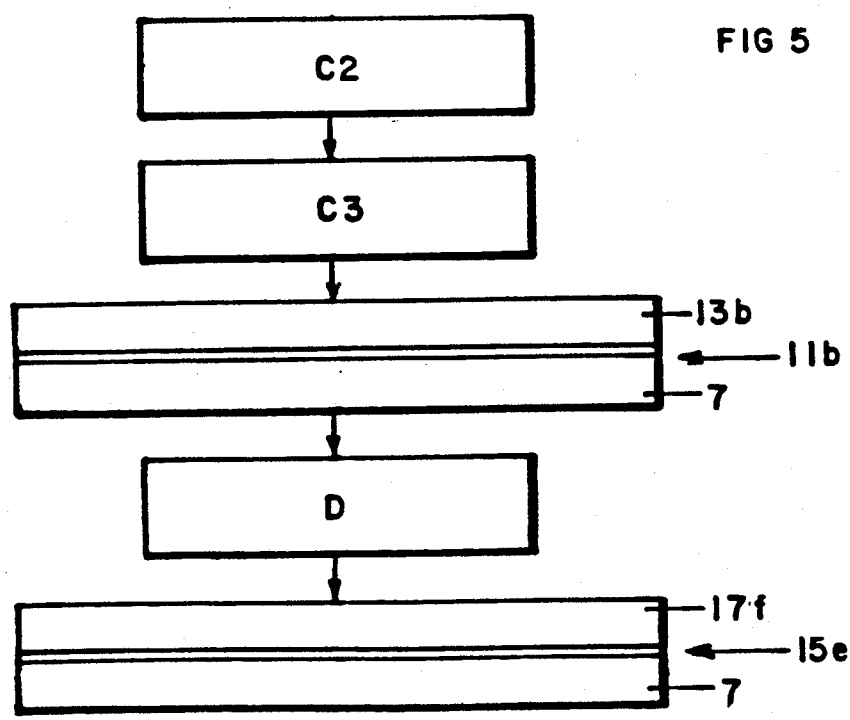
FIG. 5 is a schematic diagram of a portion of a preferred thick film process.

A preferred process for producing thick film electrically conductive RAC layers on barrier clad substrates can be appreciated by reference to the schematic diagram shown in FIG. 5. In Step C2 a composition containing particles of metal-ligand compounds is obtained. Each particle contains rare earth, alkaline earth, and copper atoms in the same ratio desired in the final RAC containing conductive layer. Further, the atoms are intimately intermixed so that the composition of each particle is preferably essentially uniform. Associated with the metal atoms and completing the compounds are volatilizable ligands, which can be all alike or chosen from among different ligands.

The particles can be of any size convenient for coating. The particles can exhibit a mean diameter up to the thickness of the coating to be formed, but more uniform films are realized when the mean particle diameters are relatively small in relation to the thickness of the film to be formed. The particles are preferably less than about 2 $\mu$m in mean diameter, optimally less than 1 $\mu$m in mean diameter. The minimum means diameter of the particles is limited only by synthetic convenience.

A preferred technique for producing metal-ligand compound particles is to dissolve the rare earth, alkaline earth, and copper metal ligand compounds in a mutual solvent and then to spray the solution through an atomizing nozzle into a gaseous atmosphere. The solvent is chosen to be evaporative in the gaseous atmosphere. Thus, the individual particles are dispersed in the gaseous atmosphere as liquid particles and eventually come to rest at a collection site as either entirely solid particles or particles in which the proportion of solvent has been sufficiently reduced that each of the metal-ligand compounds present has precipitated to a solid form. In the latter instance the particles by reason of the residual solvent, now no longer acting as a solvent, but only as a continuous dispersing phase, form a paste. The paste constitutes a highly convenient coating vehicle. When the particles are collected in a friable form with all or substantially all of the initially present solvent removed, it is recognized that a paste can still be formed, if desired, by adding to the particles a small amount of a liquid to promote particle cohesion—i.e., to constitute a paste.

Only a very small amount of liquid is required to promote particle cohesion and thereby form a paste. Typically the liquid constitutes less than 20 percent of the total composition weight and preferably less 15 percent of the total compositon weight. While optimum paste consistencies can vary depending upon the selection of processes for coating the paste, it is generally contemplated that the paste viscosity will be in the range of from $5 \times 10^4$ to $3 \times 10^6$ centipoise, preferably from $1 \times 10^5$ to $2.5 \times 10^6$ centipoise.

While atomization and drying can be undertaken in air at room temperatures, it is recognized that any gaseous medium which does not detrimentally react with the metal-ligand compounds can be employed. Further, the temperature of the liquid forming the particles or, preferably, the gaseous medium can be increased to accelerate the solvent evaporation rate, provided only that such elevated temperatures in all instance be maintained below the thermal decomposition temperatures of the metal-ligand compounds.

The advantage of solidifying the metal-ligand compounds while they are trapped within discrete particles is that bulk separations of the rare earth, alkaline earth, and copper are prevented. The particle preparation approach offers distinct advantages over simply evaporating bulk solutions to dryness in that each particle produced by the process of this invention contains the desired ratio of rare earth, alkaline earth, and copper elements. This produces a solid particle coating composition of microscale uniformity.

In Step C3 of the preparation process, onto a substrate are coated the metal-ligand compound particles, preferably combined with a carrier liquid to form a coatable paste or slurry. The resulting coated article 11b as schematically shown consists of barrier clad substrate 7 and a layer 13b formed by RAC precursors (metal-ligand compounds) and film forming solvent. Although the layer 13b is shown coextensive with the barrier clad substrate 7, it is appreciated that the particles are well suited, particularly when coated in the form of a paste or slurry, to being laid down in any desired pattern on the barrier clad substrate. The paste can, for example, be deposited by any of a variety of conventional image defining coating techniques, such as screen or gravure printing. Since thick conductive films are most commonly formed in the art by screen printing, the present invention is highly compatible with conventional printed circuit preparation processes.

The ligands in the RAC precursor compounds of the thick film process like those of thin film process form no part of the final article and therefore can be chosen based solely upon convenience in performing the process steps described above. Ligands are chosen for their ability to form solutions in which rare earth, alkaline earth, and copper combined with the ligands are each soluble in the desired proportions and to be volatilizable during heating to form the intermediate RAC layer. Inorganic ligands, such as nitrate, sulfate, and halide ligands, are illustrative of preferred ligands satisfying the criteria set forth above. Nitrate, bromide, and chloride ligands are particularly preferred. In general the ligands are chosen so that each of the rare earth, alkaline earth, and copper ligand compounds exhibit approximately similar solubility characteristics.

Any evaporative solvent for the metal-ligand compounds can be employed for particle fabrication. Again, the solvent forms no part of the final article. Polar solvents, such as water or alcohols (e.g., methanol, ethanol, propanol, etc.), are particularly suited for use with metal-ligand compounds containing the inorganic ligands noted above.

Where a paste is coated, the paste contains either a small residual portion of the original solvent for the metal-ligand compounds or a different liquid to promote cohesion. The liquid fraction of the paste must be volatilizable. The evaporative solvents noted above all satisfy this criteria.

The paste, apart from the metal-ligand particles, can be identical in composition to conventional inks employed in screen printing. Screen printing inks normally contain an active ingredient (in this instance supplied by the metal-ligand particles), binders to promote substrate adhesion (such as glass frit or crystalline oxide powder), screening agents used to enhance the rheological properties of the ink—usually a higher molecular weight polymer, such as poly(vinyl alcohol) or poly(ethylene glycol), and a liquid, most commonly water or an alcohol. It is a particular advantage of this invention that the metal-ligand particles and liquid together provide excellent rheological and adhesion properties without the necessity of incorporating other screen printing ink ingredients.

Heating step D can be performed as described above can then be undertaken to produce final article 15e consisting of thick film RAC layer 17f on barrier clad substrate 7 as described above in connection with FIG. 1. The overall heating step D can include the same sequence of steps D1, D2, D3, and D4 described above in connection with FIG. 2.

In addition to all of the advantages described above for the preferred thin film forming process, a particular advantage of thick film process is that it readily lends itself to the formation of electrical conductor patterns on limited portions of substantially planar substrate surfaces without resorting to uniform coatings followed by etching to define a pattern. This is a convenience which assumes an added level of importance in producing thick film conductors. Thus, the present process is readily applied to the fabrication of printed and hybrid circuits. The thick film process can also be employed to form RAC layers of less than 5 μm in thickness—that is, it is capable of forming either thick or thin film electrical circuit elements.

To achieve articles according to this invention which are not only electrically conductive, but also exhibit high $T_c$ levels, thereby rendering them attractive for high conductivity (e.g., superconducting) electrical applications, RAC layers are produced in specific crystalline forms. One specifically preferred class of high $T_c$ articles according to this invention are those in which the crystalline RAC layer consists of greater than 45 percent by volume of a rare earth alkaline earth copper oxide which is in a tetragonal $K_2NiF_4$ crystalline phase. The $K_2NiF_4$ crystalline phase preferably constitutes at least 70 percent and optimally at least 90 percent by volume of the RAC layer.

A preferred rare earth alkaline earth copper oxide exhibiting this crystalline phase satisfies the metal ratio:

$$L_{2-x}:M_x:Cu \qquad (I)$$

where
L is lanthanide,
M is alkaline earth metal, and
x is 0.05 to 0.30.

Among the preferred lanthanides, indicated above, lanthanum has been particularly investigated and found to have desirable properties. Preferred alkaline earth metals are barium and strontium. Optimum results have been observed when x is 0.15 to 0.20.

Thus, in specifically preferred forms of the invention LBC or LSC layers exhibiting a tetragonal $K_2NiF_4$ crystalline phase are present and capable of serving high conductivity applications, including those requiring high $T_c$ levels and those requiring superconductivity at temperatures in excess of 10°K. Specific LBC layers in the tetragonal $K_2NiF_4$ crystalline phase have been observed to have $T_c$ levels in excess of 40° K.

Another specifically preferred class of high $T_c$ articles according to this invention are those in which the crystalline RAC layer consists of greater than 45 percent by volume of a rare earth alkaline earth copper oxide which an $R_1A_2C_3$ crystalline phase, believed to be an orthorhombic Pmm2 or orthorhombically distorted perovskite crystal phase. This phase preferably constitutes at least 70 percent by volume of the RAC layer.

A preferred rare earth alkaline earth copper oxide exhibiting this crystalline phase satisfies the metal ratio:

$$Y:M_2:Cu_3 \qquad \text{(II)}$$

where
M is barium, optionally in combination with one or both of strontium and calcium.

Although the $R_1A_2C_3$ crystalline phase by its crystal lattice requirements permits only a specific ratio of metals to be present, in practice differing ratios of yttrium, rare earth, and copper are permissible. The metal in excess of that required for the $R_1A_2C_3$ crystalline phase is excluded from that phase, but remains in the YAC layer.

Processing temperatures employed in forming the amorphous RAC layers and in subsequently converting the amorphous layers to crystalline layers can vary significantly, depending upon the specific RAC composition and crystal form under consideration. Crystallization is in all instances achieved below the melting point of the RAC composition. Melting points for RAC compositions vary, but are typically well above 1000° C. Typical RAC crystallization temperatures are in the range of from about 900 to 1100° C. Where crystal nucleation and growth are undertaken in separate steps, nucleation is preferably undertaken at a somewhat lower temperature than crystal growth.

In some instances X-ray diffraction has revealed the presence of microcrystals in the amorphous RAC layer, although limited to minor amounts. While crystallization of the metal-ligand compounds, which tends to separate the metals into different phases, is generally avoided, crystallization which occurs during or immediately following ligand volatilization is not objectionable, since metals absent their ligands are free to form mixed metal oxides.

A preferred technique for producing a high $T_c$ coating employing an amorphous layer of the LAC composition metal ratio I above, particularly an LBC or LSC composition, is to heat the amorphous layer on the substrate to a temperature of about 925° to 975° C. to achieve crystal nucleation. Crystal growth is then undertaken at a temperature of about 975° to 1050 ° C. Following conversion of the LAC layer to the tetragonal $K_2NiF_4$ crystalline phase, it is cooled slowly at rate of of 25° C. or less per minute until it reaches a temperature of 550° to 450° C. The LAC layer is then held at this temperature or reheated to this temperature in the presence of an oxygen atmosphere until oxygen equilibration is substantially complete, typically about 20 to 120 minutes.

A preferred technique for producing a high $T_c$ coating employing an amorphous layer of the YAC composition satisfying metal ratio II above, particularly YBC, is to heat the amorphous layer on the substrate to a temperature of a temperature greater than 900° C., but less than 950° C., optimally 920° to 930° C. Following conversion of the LAC layer to the $R_1A_2C_3$ crystalline phase, it is cooled slowly at rate of of 25° C. or less per minute until it reaches a temperature of 750° to 400° C. The YAC layer is then held at this temperature or reheated to this temperature following cooling in the presence of an oxygen atmosphere until oxygen equilibration is substantially complete, typically about 20 to 120 minutes.

In general any conventional electrical conductor substrate, whether it is itself conductive, insulative, or semiconductive, capable of withstanding processing temperatures can be employed. For example, substrates in the form of metal wires, glass fibers, ceramic and glass plates, semiconductor wafers, and the like all possess sufficient thermal stability to be employed as substrates in the circuit elements of this invention.

Because temperatures in the range of 900° C. and higher are required for RAC layer crystallization to its preferred electrically conductive forms, all substrate materials examined have been observed to interact to some degree with the RAC layer to degrade its electrical conduction characteristics—that is, to increase. This includes common circuit element substrate materials such as silicon (e.g., polycrystalline and monocrystalline silicon of the type employed in semiconductor manufacture), silicon dioxide (e.g., fused, crystalline, and amorphous forms), silicon nitride (e.g., nitride layers grown on monocrystalline silicon), and alumina (e.g., amorphous, polycrystalline, and monocrystalline forms). Slightly more unusual substrate materials, such as alkaline earth oxides (e.g., amorphous or monocrystalline magnesia and monocrystalline strontium titanate), chosen specifically for their compatibility with the RAC layer have also been observed to degrade the conductivity characteristics of crystalline RAC layers when the substrate is formed in direct contact with the RAC layer. This is particularly true in forming thin films as described above, although substrate interactions can be reduced or controlled by undertaking repetitions of the RAC layer preparation process through the step of forming the amorphous RAC layer prior to crystallization, as discussed above.

It is the discovery of this invention that specifically selected metals as well as their oxides and silicides when interposed between a substrate (specifically illustrated by, but not limited to the common substrates identified above) and the RAC layer enhances the electrical conduction properties of the RAC layer. These barrier materials minimize diffusion or migration between the substrate and the RAC layer during the heating stages of its formation, particularly the crystallization stage, which requires temperatures in the range of 900° C. and higher.

While thick films of barrier material can separate the RAC layer and the substrate, it is a significant advantage of this invention that thin film barrier layers are effective. Thin films minimize the amount of material required to form barrier layers and are much more compatible with the microminiaturization requirements of electronic components, particularly integrated circuit components, where both precise pattern definitions, more readily generated with very thin films, and limited disparities in layer heights, achievable only with very thin films, are often required.

Observable improvements in RAC layer conduction properties can be realized with extremely thin barrier layers. For example, at least some reduction in substrate interaction of the RAC layer can be expected so long as the barrier material forms a continuous layer. Continuous barrier layer thicknesses of greater than 500, preferably greater than 1000, and optimally greater than 5000 Angstroms are contemplated.

The effectiveness of the barrier layer at a particular thickness is related to its crystallinity. An ideal barrier layer would be a continuous monocrystalline layer, such as a layer epitaxially grown on an underlying substrate. Any such requirement would, however, greatly restrict the classes of substrates capable of being modified by a barrier layer. Microcrystalline barrier layers are specifically contemplated. Any diffusion within the the barrier layer predominantly directed to circuitous intersticial boundaries between adjacent microcrystals. The microcrystals themselves act as barriers to diffusion.

Preferred barrier layers are amorphous. Achieving amorphous deposition places no restriction on substrate selection. In other words any type of substrate described above can be employed in combination with an amorphous barrier layer. At the same time, there are no grain boundaries present to provide preferential internal diffusion paths. Hence migration through amorphous barrier layers is highly impeded.

Amorphous barrier layers can be readily formed by employing the techniques described above for forming amorphous RAC layers, particularly those described for forming thin films. That is, barrier layers can be formed starting with barrier precursors, barrier metal-ligand compounds, where the ligands are chosen in the same manner as described in connection with RAC precursors.

Since the barrier layer is present during the heating steps which produce the crystalline RAC layer, it is appreciated that the barrier layer initially produced as an amorphous layer and lying beneath an amorphous RAC layer may be converted to a microcrystalline form in the course of producing a crystalline RAC layer. Using mixtures of ligands to form the barrier metal-ligand compounds, employing mixtures of barrier metals or other compatible metals, or both, can be relied upon to increase the complexity of atomic spatial relationships within the barrier layer and thereby favor an amorphous as opposed to a crystalline physical form.

Barriers of magnesia and oxides of group IVA metals (particularly zirconia) are most conveniently formed by the use of barrier metal-ligand compounds, as described above. Suitable barrier metal-ligand compounds can be formed by substitution of the barrier metal for any one of the rare earth, alkaline earth, and copper in the metal-ligand compounds described above for forming the RAC layer.

A preferred approach for forming elemental metal barrier layers is to deposit the metal on the substrate by conventional electron beam deposition techniques. In subsequent heating, preferably before deposition of the RAC precursor coating, the barrier metal can, if desired, be converted to the corresponding oxide or silicide. For example, where the substrate receiving the barrier metal is silicon, the formation of a silicide can be readily achieved. Platinum group metals are contemplated for deposition in elemental form. When coated on a silicon substrate platinum group metals can be converted to the corresponding silicide. The platinum group metals are particularly suited for forming silicides, since they are essentially resistant to oxygen attack. Restriction of the availability of oxygen can be used to cause the remaining barrier metals to favor silicide formation.

Zirconium when coated on a silicon substrate in the presence of oxygen has been observed to form mixtures of zirconia and zirconium silicide. Magnesium when coated on a silicon substrate and heated in oxygen forms magnesium silicates.

The times and temperatures effective to convert a barrier metal to the corresponding oxide or silicide can be detemined by routine investigation. For heating times of from 10 to 60 minutes in oxygen temperatures in the range of from 600° to 1500° C. are effective, the specific choice of conditions depending upon the exact choice of barrier metal, substrate and the degree of reaction by the barrier metal being sought.

It is appreciated that the barrier layer can alternatively be formed by any other convenient conventional preparation process. It is specifically contemplated to form barrier layers by sputtering, vacuum vapor deposition, and metal-organic chemical vapor deposition procedures.

EXAMPLES

Details of the preparation and performance of articles according to this invention are illustrated by the following examples:

EXAMPLE 1

A thin film of zirconia ($ZrO_2$) was produced on a polished fused quartz (glass) substrate. The film was prepared by the thermal decomposition of a precursor solution consisting of toluene as a solvent and 50 percent by weight, based on total weight, of zirconium n-propoxide tri-neodecanoate. The zirconium n-propoxide tri-neodecanoate was prepared by mixing stoichiometric amounts of zirconium n-propoxide and neodecanoic acid at room temperature.

The above precursor was spin coated onto the fused quartz substrate at 5000 rpm over a period of 20 seconds. The film was then heated to 500° C. on a hot plate. The resulting zirconia film was specularly transparent and approximately 1400 Å in thickness. This coating technique was performed a total of four times, resulting in a final zirconia barrier layer thickness of 5600 Å.

A high transition temperature superconductive YBC layer was deposited onto the barrier layer using the following technique:

A yttrium containing solution was prepared by mixing and reacting yttrium acetate with a stoichiometric excess of 2-ethylhexanoic acid to produce yttrium tri(2-ethylhexanoate) in 2-ethylhexanoic acid. The resulting solution contained 7.01 percent by weight yttrium, based on total weight.

A copper containing solution was prepared by mixing and reacting copper acetate with a stoichiometric excess of 2-ethylhexanoic acid to form copper di(2-ethylhexanoate). This solution contained 6.36 percent by weight copper, based on total weight.

A 0.81 g sample of the yttrium containing solution and a 1.92 gram sample of the copper containing solution were mixed followed by the addition of 0.66 gram of barium di(cyclohexanebutyrate), 0.4 gram of toluene, and 0.7 gram of rosin. Heat was applied until all ingredients had entered solution, thereby forming a YBC precursor solution.

The YBC precursor solution was deposited onto the zirconia barrier layer by spin coating at 5000 rpm for 20 seconds. The coated substrate had a smooth and uniform appearance with no imperfections being noted on visual inspection, indicating favorable rheological properties.

The YBC precursor coated barrier layer and substrate were heated on a hot plate to 550° C. to eliminate organic ligands from the coating. The resulting film was 4000 Å in thickness. The film forming process was twice repeated.

The amorphous RAC layer exhibited a 1:2:3 atomic ratio of Y:Ba:Cu and a thickness of 1.2 μm. The amorphous YBC layer was heated to 900° C. for 3 minutes and allowed to cool at a rate of less than 25° C. per minute.

A second element was prepared identically as described, except that the zirconia barrier layer was omitted. Both elements produced were examined by X-ray diffraction. The element lacking the zirconia barrier layer showed no trace of an orthorhomic perovskite structure in the YBC layer, whereas a well defined orthorhombic perovskite structure was observed in the YBC layer formed on the zirconia barrier layer. This demonstrated that the $Y_1B_2C_3$ crystalline form necessary for superconductivity was produced in the element containing a zirconia barrier layer while no such superconductive crystal structure was achieved in the absence of the zirconia barrier layer.

EXAMPLE 2

Example 1 was repeated, but with a monocrystalline silicon substrate substituted for fused quartz and with the crystallization temperature of 900° C. being applied for 5 minutes instead of 3 minutes.

Similar results were observed. The element incorporating the zirconia barrier layer exhibited an orthorhombic perovskite crystal structure in the LBC layer while the element lacking the zirconia barrier layer did not.

EXAMPLE 3

Example 2 was repeated, except that the zirconia layer produced was only 1400 Å in thickness. The results were identical to those reported in Example 2.

EXAMPLE 4

Example 1 was repeated, excepted that the substrate used was made of sapphire cut in the (1$\bar{1}$02) orientation. Also the number of YBC layers was increased from 3 to 4.

Although the YBC film deposited directly on sapphire showed some indications of a perovskite structure, the YBC deposited over a zirconia barrier layer exhibited a much better defined perovskite structure.

At room temperature resistance of the YBC film deposited on the zirconia barrier layer was approximately 1 order of magnitude lower than the corresponding YBC film deposited directly on the substrate.

EXAMPLE 5

Example 4 was repeated, except that polycrystalline alumina was substituted for sapphire as the substrate material. Similar results were observed. The element with the zirconia barrier layer interposed between the substrate and the YBC film exhibited a more clearly defined perovskite crystal structure than was the case with the barrier layer omitted.

EXAMPLE 6

A silicon wafer was coated with a 2 μm thick layer of titanium metal by electron beam deposition. Next YBC precursor solution of the following composition was spin coated onto the barrier layer coated substrate:
30.4 g 2-Ethylhexanoic acid,
4.089 g Yttrium tri(2-ethylhexanoate),
8.125 g Barium di(cyclohexane butyrate),
8.26 g Copper di(2-ethylhexanoate),
4.0 g Toluene, and
7.6 g Rosin.

The YBC precursor solution was prepared by dissolving the yttrium, barium, and copper carboxylates and rosing in the 2-ethylhexanoic acid and toluene solvent mixture. The solution was refluxed for 5 minutes, allowed to cool to room temperature, and then filter using a 1.2 μm filter.

A coating of the YBC precursor solution was then produced on the titanium barrier layer of the silicon wafer by spinning the silicon wafer at 2000 rpm for 20 seconds. The YBC precursor coating was then heated in air to 650° C. in a Fischer ® Model 495 ashing furnace to volatilize the organic ligands. The element was held at this temperature for 5 minutes to produce an amorphous YBC layer. This coating procedure was performed 8 times in sequence.

The amorphous YBC layer exhibited a 1:2:3 atomic ratio of Y:Ba:Cu. The amorphous YBC layer was converted to an electrically conductive crystalline form by heating in air to 875° C. in the ashing furnace. The sample was held at this temperature for 3 minutes and then allowed to cool slowly at a rate of 6° C. per minute.

X-ray diffraction analysis of the conductive crystalline YBC layer confirmed that it exhibited a well defined orthorhombic perovskite structure. A minor amount of a second, copper oxide phase was also present.

When the example was repeated, but with the titanium barrier layer omitted, no orthorhombic perovskite structure was detected by X-ray diffraction analysis.

EXAMPLE 7

Example 6 was repeated, except that prior to coating the YBC precursor solution on the barrier layer the barrier layer and substrate were heated to 1000° C. in oxygen and held at this temperature for 30 minutes. X-ray diffraction analysis of the barrier layer indicated that it contained a mixture of $TiO_2$ and TiO. The electrically conductive crystalline YBC layer was similar to that produced by Example 6.

EXAMPLE 8

Example 6 was repeated, except that zirconium was electron beam deposited in place of titanium. The conductive crystalline YBC layer produced on the zirconium barrier layer appeared on analysis by X-ray diffraction similar to that produced in Example 6.

EXAMPLE 9

Example 8 was repeated, except that prior to coating the YBC precursor solution on the barrier layer the barrier layer and substrate were heated to 1000° C. in oxygen and held at this temperature for 30 minutes. X-ray diffraction analysis of the barrier layer indicated that it contained a mixture of zirconia ($ZrO_2$) and zirconium silicide ($ZrSi_2$). The electrically conductive crystalline YBC layer was similar to that produced by Example 6.

EXAMPLES 10 and 11

These examples were identical to Examples 8 and 9, respectively, except that the thickness of the zirconium deposited was reduced to 2500 Å. The electrically conductive crystalline YBC layers were similar to those reported in Examples 7 and 8.

EXAMPLES 12 and 13

These examples were performed identically as examples 10 and 11, except that the thickness of the zirconium layer deposited was reduced to 500 Å. X-ray diffraction indicated the major portion of the crystals in the YBC coating to consist of copper and yttrium oxides in an equal atomic ratio with a minor portion of the crystals being cuprous oxide. Thus, under these preparation conditions the thickness of the zirconium deposited was not sufficient to produce the preferred orthorhombic perovskite crystalline structure.

EXAMPLE 14

Example 7 was repeated, except that a magnesium layer of 1 μm in thickness was formed by vacuum vapor deposition. X-ray diffraction indicated that heating in oxygen converted the barrier layer to magnesium silicate ($Mg_2SiO_4$) and magnesia (MgO). X-ray diffraction analysis of the electrically conductive crystalline YBC layer revealed an orthorhombic perovskite crystal structure.

EXAMPLE 15

Example 6 was repeated, except that a platinum layer of 2500 Å in thickness was formed by electron beam deposition. X-ray diffraction analysis of the electrically conductive crystlline YBC layer revealed an orthorhombic perovskite crystal structure to account for the major phase, with cuprous oxide (CuO) and $Cu_2Y_2O_5$ accounting for minor phases.

While the invention has been described in terms of one barrier layer being interposed between the RAC layer and the substrate, it is appreciated that two or more of the barrier layers described above can be employed in combination between the substrate and the RAC layer.

The invention has been described in detail with particular reference to preferred embodiments thereof, but it will be understood that variations and modifications can be effected within the spirit and scope of the invention.

What is claimed is:

1. An element comprised of a substrate and an electrically conductive layer located on the substrate characterized in that the electrically conductive layer is comprised of at least 45 percent by volume of a crystalline rare earth alkaline earth copper oxide, the substrate is formed of a material which is capable of withstanding temperatures necessary to form the conductive layer and increases the electrical resistance of the conductive layer when in contact with the rare earth alkaline earth copper oxide during its crystallization to an electrically conductive form, a barrier layer having a thickness of greater than 500 Angstroms is interposed between the electrically conductive layer and the substrate, the barrier layer being comprised of a metal in its elemental form or in the form of an oxide or silicide chosen from the group consisting of (a) group IVa metal or a platinum group metal and (b) magnesium silicide or silicate.

2. An element according to claim 1 further characterized in that the conductive layer is restricted to a portion of the substrate thereby defining a conduction path on the substrate.

3. An element according to claim 2 further characterized in that the barrier layer is restricted to the same portion of the substrate as the conductive layer.

4. An element according to claim 1 further characterized in that the substrate is comprised of glass.

5. An element according to claim 1 further characterized in that the substrate is comprised of a semiconductor.

6. An element according to claim 5 further characterized in that the semiconductor substrate is comprised of silicon.

7. An element according to claim 6 further characterized in that the barrier layer is comprised of a group IVA metal silicide or a platinum group silicide.

8. An element according to claim 6 further characterized in that the barrier layer consists essentially of a platinum group metal.

9. An element according to claim 8 further characterized in that the barrier layer consists essentially of platinum.

10. An element according to claim 6 further characterized in that the barrier layer is comprised of magnesium silicate.

11. An element according to claim 1 further characterized in that the barrier layer is comprised of a group IVA metal in its elemental form or in the form of an oxide.

12. An element according to claim 11 further characterized in that the substrate is comprised of a metal oxide other than that contained in the barrier layer.

13. An element according to claim 12 further characterized in that the substrate is comprised of alumina.

14. An element according to claim 12 further characterized in that the barrier layer consists essentially of zirconium or zirconia.

15. An element according to claim 1 further characterized in that the conductive layer exhibits a superconducting transition temperature of at least 30° K.

16. An element according to claim 15 further characterized in that the conductive layer exhibits a superconducting transition temperature of at least 80° K.

17. An element according to claim 1 further characterized in that the conductive layer consists of greater than 70 percent by volume of a crystalline conductive phase.

18. An element according to claim 1 further characterized in that the conductive layer is present in the form of a thin film having a thickness of less than 5 μm.

19. An element according to claim 1 further characterized in that the conductive layer is present in the form of a thick film having a thickness of greater than 5 μm.

20. An element according to claim 16 further characterized in that greater than 45 percent by volume of the conductive layer consists essentially of a rare earth alkaline earth copper oxide which is in a tetragonal $K_2NiF_4$ crystalline form.

21. An element according to claim 19 further characterized in that greater than 70 percent by volume of the conductive layer consists essentially of a rare earth alkaline earth copper oxide which is in a tetragonal $K_2NiF_4$ crystalline form.

22. An element according to claim 21 further characterized in that the rare earth alkaline earth copper oxide satisfies the metal ratio:

$$L_{2-x}:M_x:Cu$$

where
- L is lanthanide,
- M is alkaline earth metal, and
- x is 0.05 to 0.30.

23. An element according to claim 21 further characterized in that the lanthanide is lanthanum and the alkaline earth metal is barium or strontium.

24. An element according to claim 23 further characterized in that x is 0.15 to 0.20.

25. An element according to claim 16 further characterized in that greater than 45 percent by volume of the conductive layer consists essentially of a rare earth alkaline earth copper oxide which is in an $R_1A_2C_3$ crystalline phase.

26. An element according to claim 24 further characterized in that the rare earth alkaline earth copper oxide consists of yttrium as the rare earth and barium, optionally in combination with at least one of strontium and calcium, as the alkaline earth.

27. An element according to claim 26 further characterized in that the metals present in the $R_1A_2C_3$ crystalline phase consist essentially of yttrium, alkaline earth, and copper in a 1:2:3 mole ratio.

28. An element according to claim 27 further characterized in that the conductive layer contains at least one additional phase comprised of an oxide of at least one of rare earth, alkaline earth, and copper.

29. An element according to claim 1 further characterized in that the barrier layer is a thin film having a thickness of less than 5 $\mu$m.

30. An element according to claim 1 further characterized in the barrier layer is a continuous thin film having a thickness of greater than 1000 Å.

31. An element according to claim 29 further characterized in that the barrier layer is a continuous film having at thickness of greater than 5000 Å.

* * * * *